(12) United States Patent
Martin et al.

(10) Patent No.: US 11,070,200 B2
(45) Date of Patent: Jul. 20, 2021

(54) DUTY CYCLE CORRECTION SYSTEM AND LOW DROPOUT (LDO) REGULATOR BASED DELAY-LOCKED LOOP (DLL)

(71) Applicant: Intel Corporation, Santa Clara, CA (US)

(72) Inventors: Aaron Martin, El Dorado Hills, CA (US); Roger Cheng, San Jose, CA (US); Hari Venkatramani, San Jose, CA (US); Navneet Dour, El Dorado Hills, CA (US); Mozhgan Mansuri, Hillsboro, OR (US); Bryan Casper, Ridgefield, WA (US); Frank O'Mahony, Portland, OR (US); Ganesh Balamurugan, Hillsboro, OR (US); Ajay Balankutty, Hillsboro, OR (US); Kuan Zhou, Portland, OR (US); Sridhar Tirumalai, Chandler, AZ (US); Krishnamurthy Venkataramana, Folsom, CA (US); Alex Thomas, El Dorado Hills, CA (US); Quoc Nguyen, El Dorado Hills, CA (US)

(73) Assignee: Intel Corporation, Santa Clara, CA (US)

(*) Notice: Subject to any disclaimer, the term of this patent is extended or adjusted under 35 U.S.C. 154(b) by 117 days.

(21) Appl. No.: 16/144,949

(22) Filed: Sep. 27, 2018

(65) Prior Publication Data

US 2020/0106430 A1    Apr. 2, 2020

(51) Int. Cl.
*H03K 5/156* (2006.01)
*H03L 7/081* (2006.01)
(Continued)

(52) U.S. Cl.
CPC .......... *H03K 5/1565* (2013.01); *G06F 1/08* (2013.01); *G11C 7/1057* (2013.01);
(Continued)

(58) Field of Classification Search
CPC ....... G06F 1/08; G11C 7/1057; G11C 7/1066; G11C 7/1084; G11C 7/1093; G11C 7/222; H03L 7/0812
See application file for complete search history.

(56) References Cited

U.S. PATENT DOCUMENTS 5,414,381 A *  5/1995  Nelson ............... G06F 1/10
                                                     327/262
8,508,272 B2    8/2013  Chung
(Continued)

FOREIGN PATENT DOCUMENTS

KR    20110098389    9/2011
KR    10-1382500     4/2014

OTHER PUBLICATIONS

Musah, Tawfiq et al., "A 4-32 Gb/s Bidirectional Link With 3-Tap FFE/6-Tap DFE and Collaborative CDR in 22 nm CMOS", IEEE Journal of Solid-State Circuits, vol. 49, No. 12, Dec. 2014, 12 pgs.
(Continued)

*Primary Examiner* — Jaweed A Abbaszadeh
*Assistant Examiner* — Hyun Soo Kim
(74) *Attorney, Agent, or Firm* — Green, Howard & Mughal LLP

(57) ABSTRACT

An apparatus is provided, where the apparatus includes a plurality of components; a first circuitry to generate a clock signal, and to supply the clock signal to the plurality of components; a second circuitry to estimate, for each of two or more components of the plurality of components, a corresponding duty cycle of the clock signal received at the corresponding component, wherein two or more duty cycles
(Continued)

corresponding to the two or more components are determined; a third circuitry to determine an average of the two or more duty cycles; and a fourth circuitry to correct a duty cycle of the clock signal generated by the first circuitry, based at least in part on the average.

25 Claims, 10 Drawing Sheets

(51) Int. Cl.
    *G11C 7/22*         (2006.01)
    *G06F 1/08*         (2006.01)
    *G11C 7/10*         (2006.01)

(52) U.S. Cl.
    CPC .......... *G11C 7/1066* (2013.01); *G11C 7/1084* (2013.01); *G11C 7/1093* (2013.01); *G11C 7/222* (2013.01); *H03L 7/0812* (2013.01)

(56) References Cited

U.S. PATENT DOCUMENTS

| | | |
|---|---|---|
| 9,035,684 B2 | 5/2015 | Jung et al. |
| 9,998,125 B2 | 6/2018 | Balamurugan et al. |
| 10,361,690 B1* | 7/2019 | Addepalli ................. G06F 1/06 |
| 2001/0013100 A1* | 8/2001 | Doblar ................... G11C 5/063 |
| | | 713/400 |
| 2007/0252631 A1* | 11/2007 | Kaviani .................... G06F 1/10 |
| | | 327/295 |
| 2009/0128207 A1* | 5/2009 | Chang ...................... G06F 1/06 |
| | | 327/175 |
| 2010/0271092 A1* | 10/2010 | Zerbe ................... G11C 7/1093 |
| | | 327/161 |
| 2014/0002156 A1* | 1/2014 | Dwivedi .............. H03K 5/1565 |
| | | 327/175 |
| 2015/0097603 A1 | 4/2015 | Amirkhany et al. |
| 2016/0241249 A1* | 8/2016 | Balamurugan ........... H03L 7/00 |
| 2019/0097617 A1* | 3/2019 | Koch ................... H03K 5/1565 |

OTHER PUBLICATIONS

International Search Report and Written Opinion from PCT/US2019/039061 dated Oct. 11, 2019, 15 pgs.

\* cited by examiner

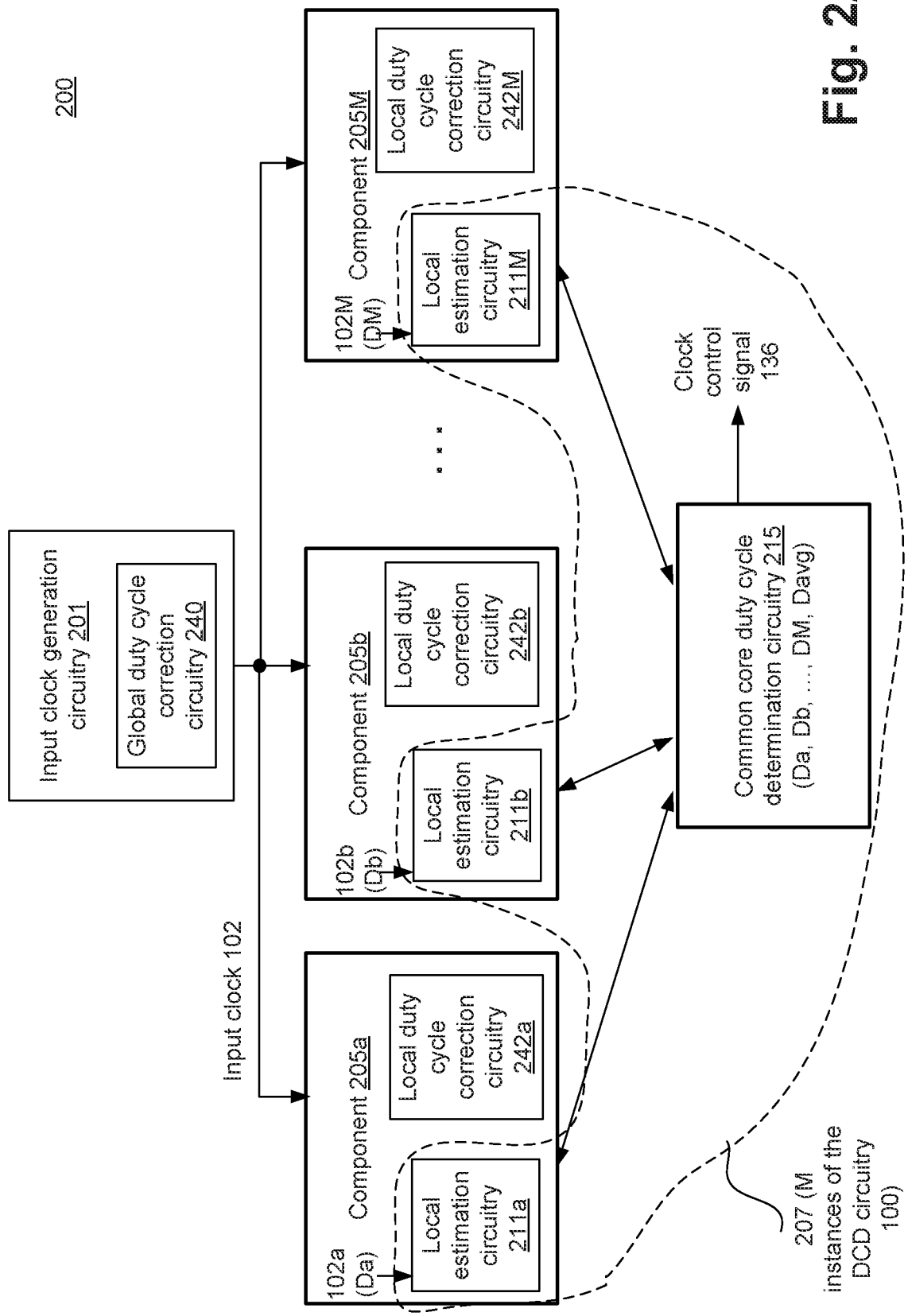

DUTY CYCLE CORRECTION SYSTEM AND LOW DROPOUT (LDO) REGULATOR BASED DELAY-LOCKED LOOP (DLL)

BACKGROUND

In a computing device, different components may operate on a same clock signal. For example, a parallel memory interface may include tens, or even hundreds of transmit/receive (Tx/Rx) buffers receiving a clock signal. An error in the duty cycle of the clock signal may result in sub-optimal or erroneous performance of the computing device.

In a computing device, all-digital delay-locked loops (ADDLLs) are well suited for advanced technologies due to their portability and scalability. However, compared to analog delay locked loops (DLLs), ADDLLs may suffer from jitter, poor area, power efficiency, etc.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2A illustrates a system comprising multiple distributed implementations of the DCD circuitry of FIG. 1, according to some embodiments.

DETAILED DESCRIPTION

Figure 1:
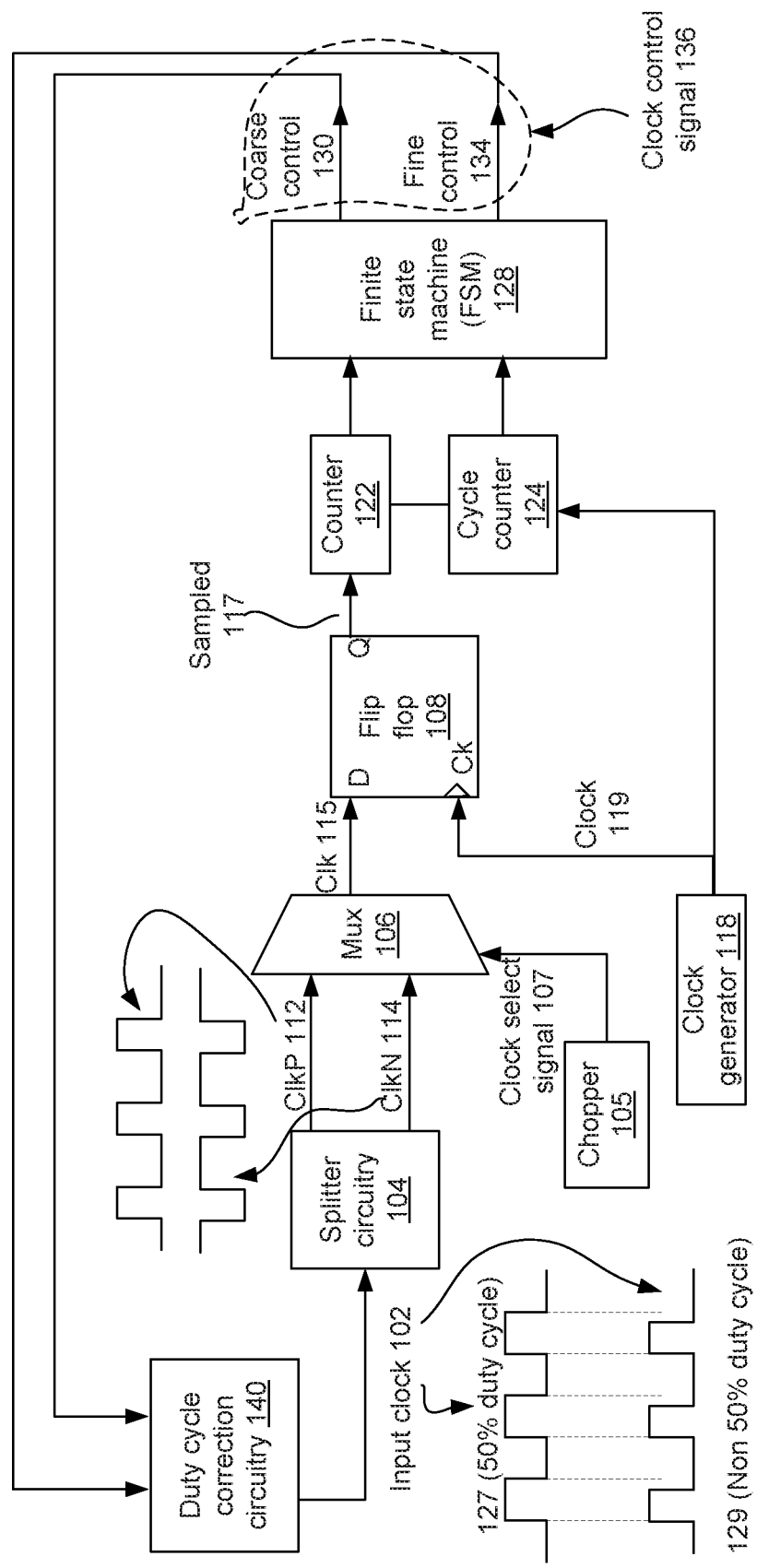
FIG. 1 schematically illustrates a duty cycle detection (DCD) circuitry for estimating a duty cycle for an input clock signal using an asynchronous clock signal, according to some embodiments.

In an example, a duty cycle detection (DCD) circuitry estimates a duty cycle of an input clock. The DCD circuitry comprises, among other components, a sampling circuitry (e.g., which may be a flip-flop), one or more counters, an asynchronous clock generator (e.g., to generate a clock that is asynchronous with respect to the input clock), a finite state machine (FSM), etc.

In some embodiments, the input clock is received by a plurality of components, and it may be useful to determine the duty cycles of the input clock received by the plurality of components. For example, a plurality of DCD circuitries may respectively determine a plurality of duty cycles of the input clocks received by the plurality of components, respectively.

However, separately implementing the plurality of DCD circuitries respectively in the plurality of components may be resource intensive (e.g. may increase a cost and/or area of the system). To overcome such issues, in some embodiments, each component has a sampling circuitry of a corresponding DCD circuitry. Also, the plurality of DCD circuitries shares various common core components. For example, the plurality of DCD circuitries shares the one or more counters, the asynchronous clock generator, the FSM, etc. The shared resources are used by the plurality of DCD circuitries in a time-multiplexed manner.

Once the plurality of duty cycles are determined, in some embodiments, an average duty cycle may be determined. An error between the average duty cycle and a target duty cycle may be used to correct any error in the duty cycle of the input clock.

Various embodiments and examples of this disclosure also discusses an all-digital delay-locked loop (ADDLL). The ADDLL comprises a low dropout regulator (LDO) based supply noise rejection circuitry, which reduces supply noise induced jitter in the ADDLL. Furthermore, the ADDLL comprises a charge-sharing digital to analog converter (CS-DAC), which includes a switched-capacitor loop filter, e.g., to convert one bit digital error signal (e.g., indicative of an error between an input clock and an output clock generated by the ADDLL) to an analog control signal. The analog control signal is used to generate a regulation signal using the LDO based supply noise rejection circuitry, where the regulation signal is used to control the delay lines of the ADDLL. The CS-DAC may achieve a high resolution (e.g., 10-bit resolution) and may reduce (e.g., minimizes) dithering jitter that may be inherent to conventional digital feedback loop. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

It is pointed out that those elements of the figures having the same reference numbers (or names) as the elements of any other figure can operate or function in any manner similar to that described, but are not limited to such.

FIG. 1 schematically illustrates a duty cycle detection (DCD) circuitry 100 (also referred to as circuitry 100) for estimating a duty cycle for an input clock signal 102 using an asynchronous clock signal 119, according to some embodiments.

The term "duty cycle" refers to a ratio of: (i) a duration of logical high cycle (or active state) of a signal over a time period, and (ii) the time period. This ratio is expressed as a percentage. For example, a duty cycle of 50% of a signal refers to the signal having a logical low cycle which is equal in time duration as its logical high cycle. For example, over a time period T, if a signal is high for T1 time, then the duty cycle is (T1/T)×100%. Merely as an example, FIG. 1 illustrates two example signals 127 and 129 for the input clock 102—the signal 127 has about 50% duty cycle, and the signal 129 has a duty cycle that is less than 50%. The circuitry 100 estimates the duty cycle of the input clock 102.

The input clock 102 is received by a splitter circuitry 104, which generates differential clock signals ClkP 112 and ClkN 114, where ClkP 112 is 180 degree out of phase relative to ClkN 114. An example of the differential clock signals ClkP 112 and ClkN 114 are illustrated in FIG. 1.

For purposes of this disclosure, labels for signals and nodes carrying those signals are interchangeably used. For example, ClkP 112 is used to indicate a node ClkP 112 carrying the signal ClkP 112, or the signal ClkP 112, e.g., depending on the context of the sentence.

The circuitry 100 comprises a multiplexer 106, which receives the ClkP 112 signal and the ClkN signal 114, and outputs a clock signal Clk 115 according to a clock select signal 107 provided by a chopper 105. In some embodiments, the Clk signal 115 is sampled by a flip flop 108. The flip flop 108 may be a D-type flip flop that is clocked using the asynchronous clock 119 generated by an asynchronous clock generator circuitry 118. In some other examples, any other appropriate edge triggered sequential units may be used for flip flop 108.

Because the flip flop 108 is to sample the Clk signal 115, the flip flop 108 is also referred to as a sampling circuitry 108. Although the flip flop 108 is used to sample the Clk signal 115, any other appropriate sampling circuitry may also be used to sample the Clk signal 115.

In some examples and although not illustrated in FIG. 1, the clock select signal 107 is generated from the clock 119. For example, the chopper circuitry 105 may receive the clock 119, and divide the clock 119 by an appropriate number to generate the clock select signal 107.

In an example, the clock 119 (and the clock select signal 107) has no relationship (e.g., frequency and/or phase relationship) with the input clock signal 102. For example, the rising and falling edges and frequency of the clock 119 is not synchronized with input clock signal 102. Hence, the clock signal 119 is also referred to as an asynchronous clock signal with respect to the clock signal 102, and the clock generator 118 is also referred to as an asynchronous clock generator 118.

In some embodiments, the clock 119 is used for random sampling of the ClkP 112 and/or ClkN 114, e.g., to determine the duty cycle of the input clock 102.

The output of the flip flop 108 is received by a counter 122. In some embodiments, the clock select signal 107 first causes the multiplexer 106 to select ClkP 112, which is passed on as Clk 115 to the flip flop 108. As discussed herein above, the clock select signal 107 is derived using a divider (not illustrated in FIG. 1) operating on the clock 119. In such examples, the clock select signal 107 toggles every 'N' cycles of the clock 119, where 'N' is the divider ratio. In some embodiments, on a rising (or falling) edge of the clock 119, the flip flop 108 samples the Clk 115 and outputs a sampled signal 117 for the counter 122. In some embodiments, the counter 122 is a one's counter and counts up when logical level of the sampled signal 117 (e.g., which is the sampled version of Clk 115) is high (e.g., counts number of logical highs).

Thus, initially (e.g., during or in a time period of the first N cycles of the clock 119, during which the ClkP 112 is output as the Clk 115 by the multiplexer 106), on a rising (or falling) edge of the clock 119, the flip flop 108 samples the ClkP 112 and outputs the sampled signal 117 for the counter 122. The counter 122 counts up when logical level of the sampled signal 117 (e.g., which is now the sampled version of ClkP 112) is high (e.g., the counter 122 counts the number of logical highs in the ClkP 112 during the initial N cycles of the clock 119).

After N number of cycles of the clock 119, the clock select signal 107 causes the multiplexer to select ClkN 114, which is passed on as the Clk 115 to the flip flop 108. ClkN 114 is an inverse of the ClkP 112.

There may be no dependence between the sampled values and the clock select signal 107 for the multiplexer 106. In some embodiments, the clock select signal 107 is autonomously toggled every 'N' cycles of the clock 119, regardless of the sampled values. The counter 122 counts when logical level of sampled signal 117 (e.g., sampled version of the ClkN 114) is high.

Thus, the counter 122 keeps track of a number of one's sampled for the ClkP 112 (e.g., during the initial N cycles of the clock 119), and a number of one's sampled for the ClkN 114 (e.g., during the subsequent N cycles of the clock 119). In some embodiments, the circuitry 100 also includes a cycle counter 124 that counts a number of clock cycles of the clock 119, over which the measurements are made (e.g., over which the number of one's sampled for the ClkP 112 and for the ClkN 114 are being counted).

The counts of one's for sampled version of ClkP 112 and the counts of one's for sampled version of ClkN 114 provide an indication of the duty cycle of the input clock 102. In an example, the difference between the ratio of the counts of one's for sampled versions of ClkP 112 and ClkN 114 provides an indication of how off the duty cycle of input clock 102 is from 50%. For example, the duty cycle is based on a ratio of (i) the count of one's in the ClkP 112, and (ii) a sum of the count of one's in the ClkP 112 and ClkN 114.

A finite state machine (FSM) 128 keeps track of the counts of one's for sampled version of ClkP 112 and the counts of one's for sampled version of ClkN 114, and estimates the duty cycle of the input clock 102. In an example, the FSM 128 keep track of how far the estimates duty cycle of the clock 102 is from a target duty cycle (which may be, for example, 50%). Based on determining an error between the estimated duty cycle and the target duty cycle, the FSM 128 outputs a clock control signal 136 to correct the duty cycle of the clock.

In some embodiments, the clock control signal 136 includes a coarse control signal 130 for providing coarse control for the duty cycle error, and includes a fine control signal 134 for providing fine control for the duty cycle error. The clock control signal 136 is feedback to an appropriate duty cycle correction circuitry 140, e.g., which may be a generator of the clock 102, or any appropriate component that can correct the duty cycle of the clock 102.

Since the duty cycle of signals ClkP 112 and ClkN 114 is measured in a differential manner using merely one flip-flop 108, non-idealities (e.g., finite aperture, asymmetric response to rising/falling transitions, etc.) in the flip-flop 108 may not affect the duty cycle measurement. In some embodiments, by using an asynchronous clock 119 to sample the signals ClkP 112 and ClkN 114, sampling density function (e.g., distribution of sampling clock edges wrapped to a clock period of signals ClkP 112 and ClkN 114) approaches a uniform distribution.

Thus, the circuitry 100 is used for estimating a duty cycle of the clock 102. Variations of the circuitry 100 may be possible.

FIG. 2A illustrates a system 200 comprising multiple distributed implementations of the DCD circuitry 100 of FIG. 1, according to some embodiments. The system 200 comprises an input clock generation circuitry 201 (also referred to as circuitry 201, or as clock generation circuitry 201) that is to generate the input clock 102 of FIG. 1.

The system 200 comprises components 205a, 205b, . . . , 205M, where M is an appropriate positive integer. Elements referred to herein with a common reference label followed by a particular number or alphabet may be collectively referred to by the reference label alone. For example, components 205a, 205b, . . . , 205M may be collectively and generally referred to as components 205 in plural, and component 205 in singular.

In some embodiments, individual ones of the components 205a, 205b, . . . , 205M are to receive the clock 102. The clock 102 may be distributed to the components 205 via one or more appropriate clock distribution trees. The components 205 may be any appropriate components of the system 200, such as components receiving a clock from a common clock source. Merely as an example, individual ones of the components 205 are data transmitter and/or receiver of a parallel interface, such as a parallel memory interface. For example, the system 200 is a parallel interface system, such as a memory interface system, and at least some of the components 205 are data transmitter and/or receiver (Tx/Rx) of the memory interface system. In some embodiments, at least some of the components 205 are transmitter/receiver buffer (Tx/Rx buffer) of the memory interface system. In an example, at least some of the components are differential strobe signal generation circuitries. The type of the components 205 discussed herein are merely examples, and do not limit the scope of this disclosure.

As discussed herein, the clock 102 is distributed to the components 205 using, for example, a clock distribution tree. Due to various factors (e.g., clock distribution tree deskew, random variations, process and temperature variations, etc.), a duty cycle of the input clock 102 received by various components 205 may be slightly different. For example, when the clock 102 is transmitted to the components 205a, . . . , 205M, assume that the component 205a receives a clock 102a, the component 205b receives a clock 102b, the component 205M receives a clock 102M, and so on. Ideally, the clocks 102a, 102b, . . . , 102M are M respective instances of the same clock 102, and should have the same duty cycle. However, due to the various factors (some of which are discussed herein above), the duty cycles of the clocks 102a, 102b, . . . , 102M may be slightly different from each other.

For example, assume that the duty cycle of the clock 102a received by the component 205a is Da, the duty cycle of the clock 102b received by the component 205b is Db, the duty cycle of the clock 102M received by the component 205M is DM, and so on. Due to at least some of the factors discussed herein, Da, Db, DM, etc. may be slightly different from each other, and may possibly be different from a target or desired duty cycle Dtar.

In some embodiments and as will be discussed herein in further details, the system 200 estimates the duty cycles Da, Db, . . . , DM, and determines an average duty cycle Davg, which is an average of the duty cycles Da, Db, . . . , DM. The average duty cycle Davg may deviate from the target duty cycle Dtar. The system 200 uses the average duty cycle Davg to correct any duty cycle error in the clock 102, e.g., such that the average duty cycle Davg tracks the target duty cycle Dtar.

In some embodiments, the system 200 uses the DCD circuitry 100 of FIG. 1 to estimate the duty cycles Da, Db, . . . , DM. In the example of FIG. 1, the DCD circuitry 100 determines a duty cycle of a single clock signal 102. In the system 200 of FIG. 2A, M instances of the DCD circuitry 100 (e.g., outline or boundary of which is illustrated using a dotted line 209) are implemented.

At least a section of the M instances of the DCD circuitry 100 has a common section, referred to as "common core duty cycle determination circuitry 215," (also referred to as circuitry 215). For example, the circuitry 215 is common to each of the M instances of the DCD circuitry 100.

Furthermore, each component 205 has a corresponding local estimation circuitry 211. For example, the component 205a has the local estimation circuitry 211a, the component 205b has the local estimation circuitry 211b, the component 205M has the local estimation circuitry 211M, and so on.

As will be discussed in further details herein with respect to FIG. 2B, the local estimation circuitry 211a and the circuitry 215, in combination, forms a first instance of a DCD circuitry (e.g., similar to the circuitry 100 of FIG. 1); the local estimation circuitry 211b and the circuitry 215, in combination, forms a second instance of the DCD circuitry; the local estimation circuitry 211M and the circuitry 215, in combination, forms a $M^{th}$ instance of the DCD circuitry, and so on.

The circuitry 215 determines the duty cycles Da, Db, . . . , DM, and the average duty cycle Davg, e.g., by averaging the duty cycles Da, Db, . . . , DM. In some embodiments, the circuitry 215 outputs the clock control signal 136, e.g., which may be used to correct an error, if any, between the determined duty cycles (e.g., duty cycles Da, Db, . . . , DM, Davg) and the target duty cycle Dtar.

Merely as an example, the clock control signal 136 may be based on (Davg-Dtar), and/or may also be based on one or more of (Da-Dtar), (Db-Dtar), . . . , (DM-Dtar). The clock control signal 136 may be used to correct any error in the duty cycle.

In some embodiments, the system 200 comprises one or more duty cycle correction circuitries. For example, the clock generation circuitry 201 comprises a global duty cycle correction circuitry 240. Although the global duty cycle correction circuitry 240 is illustrated to be included in the clock generation circuitry 201, in an example, the global duty cycle correction circuitry 240 may be external, coupled to, and/or embedded within the clock generation circuitry 201. In some embodiments, individual components 205 comprise a corresponding local duty cycle correction circuitry 242.

In some embodiments, the circuitry 240 may alter phase of the input clock 102 generated by the clock generation circuitry 201; the circuitry 242a may alter phase of the clock 102a received by the component 205a; the circuitry 242M may alter phase of the clock 102M received by the component 205M; and so on, e.g., based on the clock control signal 136. The duty cycle correction circuitries 240, 242a, 242b, 242M are discussed in further details with respect to FIG. 3.

Figure 2B:
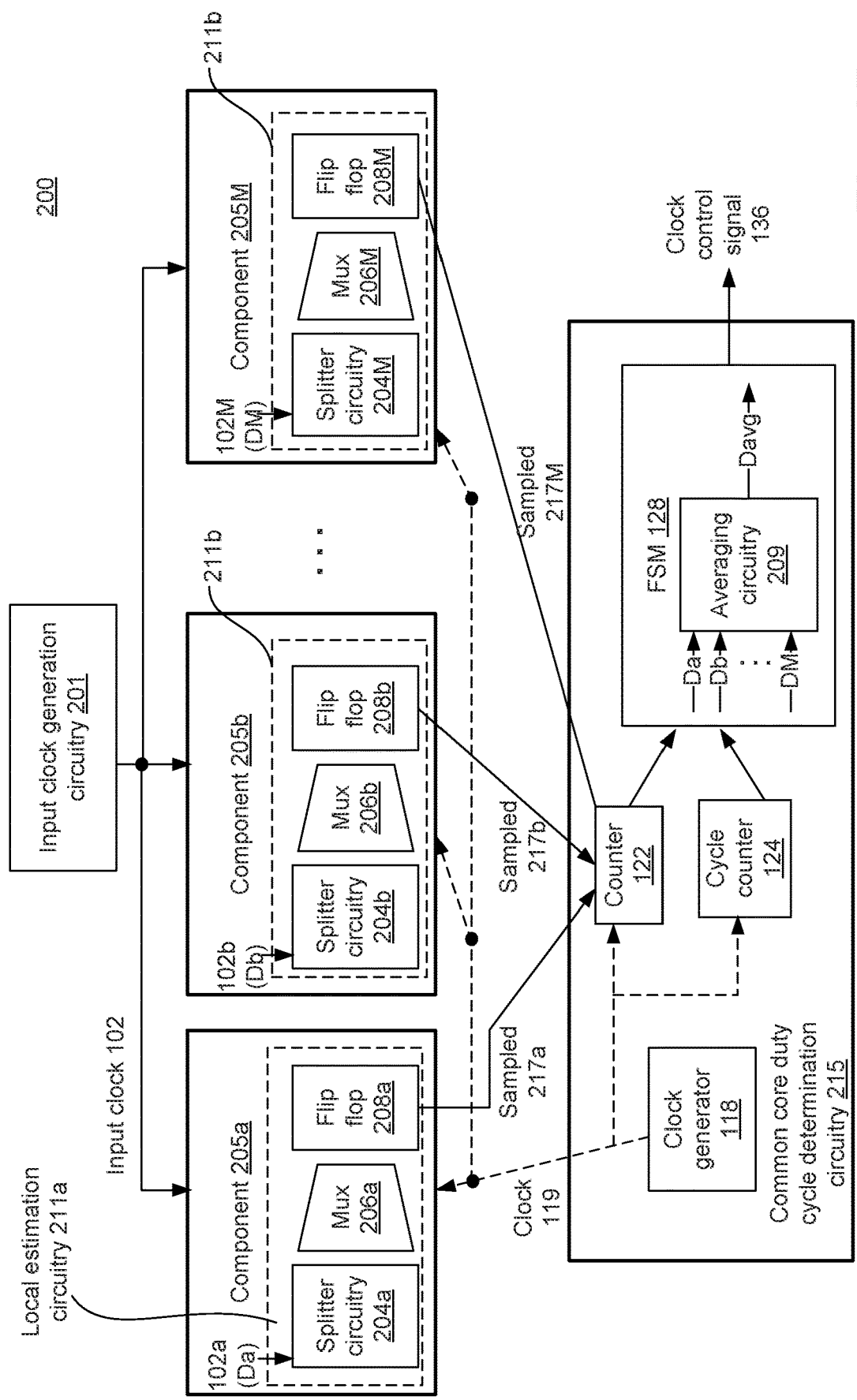
FIG. 2B illustrates an example implementation of the DCD circuitries of the system of FIG. 2A, according to some embodiments.

FIG. 2B illustrates an example implementation of M number of DCD circuitry of the system 200 of FIG. 2A, according to some embodiments. It is to be noted that the duty cycle correction circuitries 240, 242a, . . . , 242M and the boundary 207 of the instances of the DCD circuitry, which are illustrated in FIG. 2A, are not illustrated in FIG. 2B for purposes of illustrative clarity.

Referring to FIG. 2B and as discussed with respect to FIG. 2A, at least a section of the M instances of the DCD circuitry 100 has a common section, e.g., the circuitry 215. For example, the circuitry 215 is common to each of the M instances of the DCD circuitry 100.

Furthermore, each component 205 has a corresponding local estimation circuitry 211. For example, the component 205a has the local estimation circuitry 211a, the component 205b has the local estimation circuitry 211b, the component 205M has the local estimation circuitry 211M, and so on.

In some embodiments, the component 205a (e.g., the local estimation circuitry 211a) comprises a splitter circuitry 204a receiving the clock 102a and generating differential clock signals ClkP 212a and ClkN 214a (where the differential clock signals are not illustrated in FIG. 2B), e.g., similar to the splitter circuitry 104 of FIG. 1. The component 205a (e.g., the local estimation circuitry 211a) comprises a multiplexer 206a selectively outputting the differential clock signals, e.g., similar to the multiplexer circuitry 106 of FIG. 1. The component 205a (e.g., the local estimation circuitry 211a) comprises a flip flop 208a sampling the output of the multiplexer circuitry 206a to generate a sampled signal 217a, e.g., similar to the flip flop 108 of FIG. 1 generating the sampled signal 117.

Similarly, the component 205b (e.g., the local estimation circuitry 211b) comprises a splitter circuitry 204b receiving the clock 102b and generating differential clock signals ClkP 112b and ClkN 114b (where the differential clock signals are not illustrated in FIG. 2B), a multiplexer 206b selectively outputting the differential clock signals, and a flip flop 208a sampling the output of the multiplexer circuitry 206a to generate a sampled signal 217b. Similarly, the component 205M (e.g., the local estimation circuitry 211M) comprises a splitter circuitry 204M, a multiplexer 206M, and a flip flop 208M.

Thus, in general, a component 205 (e.g., a corresponding local estimation circuitry 211) comprises a corresponding splitter circuitry 204, a corresponding multiplexer 206, and corresponding a flip flop 208 to generate a corresponding sampled signal 217, e.g., similar to the splitter circuitry 104, the multiplexer 106, and the flip flop 108 of the DCD circuitry 100 of FIG. 1. Thus, in the system 200, there are M number of DCD circuitries in the system 200, where each of the M number of DCD circuitries comprises a corresponding splitter circuitry 204, a corresponding multiplexer 206, and a corresponding flip flop 208 to generate a corresponding sampled signal 217.

The system 200 further comprises the common core DCD circuitry 215 (also referred to as circuitry 215), which includes the clock generator 118, the counter 122, the cycle counter 124, and the FSM 128, e.g., similar to these components of the DCD circuitry 100 of FIG. 1. In some embodiments, the circuitry 215 is common to the M number of DCD circuitries of the system 200. Thus, the M number of DCD circuitries of the system 200 share the circuitry 215, e.g., in a time-multiplexed manner.

The clock generator 118 generates a clock signal 119, e.g., similar to the clock signal 119 of FIG. 1 (merely for purposes of illustrative clarity, the clock 119 is illustrated using dotted lines). The clock signal 119 is transmitted to the components 205a, . . . , 205M (e.g., to the flip-flops 208a, . . . , 208M). The cycle counter 124 and the counter 122 receives the clock signal 119. The FSM 128 receives the output of the cycle counter 124 and the counter 122, e.g., similar to FIG. 1.

In some embodiments, the counter 122, the cycle counter 124, and the FSM 128 operate in a time multiplexed manner. Merely as an example, during a first time period, the counter 122, the cycle counter 124, and the FSM 128 estimate the duty cycle Da for the clock 102a received by the component 205a, e.g., based on the sampled signal 217a. During a second time period (e.g., that is non-overlapping with the first time period), the counter 122, the cycle counter 124, and the FSM 128 estimate the duty cycle Db for the clock 102b received by the component 205b, e.g., based on the sampled signal 217b. During a $M^{th}$ time period (e.g., that is non-overlapping with the first and second time periods), the counter 122, the cycle counter 124, and the FSM 128 estimate the duty cycle DM for the clock 102M received by the component 205M, e.g., based on the sampled signal 217M. Determination of an individual duty cycle, based on a sampled signal, is discussed in further details with respect to FIG. 1.

Thus, in a time multiplexed manner, the system 200 determines the duty cycles Da, Db, . . . , DM. For example, there are M number of DCD circuitries in the system 200.

Each of the M number of DCD circuitries have the circuitry 215 in common. Furthermore, a first DCD circuitry has the splitter circuitry 204a, the multiplexer 206a, and the flip-flop 208a; a $M^{th}$ DCD circuitry has the splitter circuitry 204M, the multiplexer 206M, and the flip-flop 208M; and so on. These M number of DCD circuitries share the common circuitry 215 in a time multiplexed manner, to respectively determine the duty cycles Da, Db, . . . , DM.

In some embodiments, the FSM 128 (or another component of the circuitry 215) has an averaging circuitry 209 that receives the duty cycles Da, Db, DM, and determines the average duty cycle Davg, e.g., by averaging the duty cycles Da, Db, . . . , DM.

In some embodiments, the FSM 128 outputs the clock control signal 136, e.g., which may be used to correct an error, if any, between the determined duty cycles (e.g., duty cycles Da, Db, . . . , DM, Davg) and the target duty cycle Dtar. Merely as an example, the clock control signal 136 may be based on (Davg-Dtar), and/or may also be based on one or more of (Da-Dtar), (Db-Dtar), . . . , (DM-Dtar). The clock control signal 136 may be used to correct any error in the duty cycle (although no duty cycle correction circuitry is illustrated in FIG. 2B).

Figure 3:
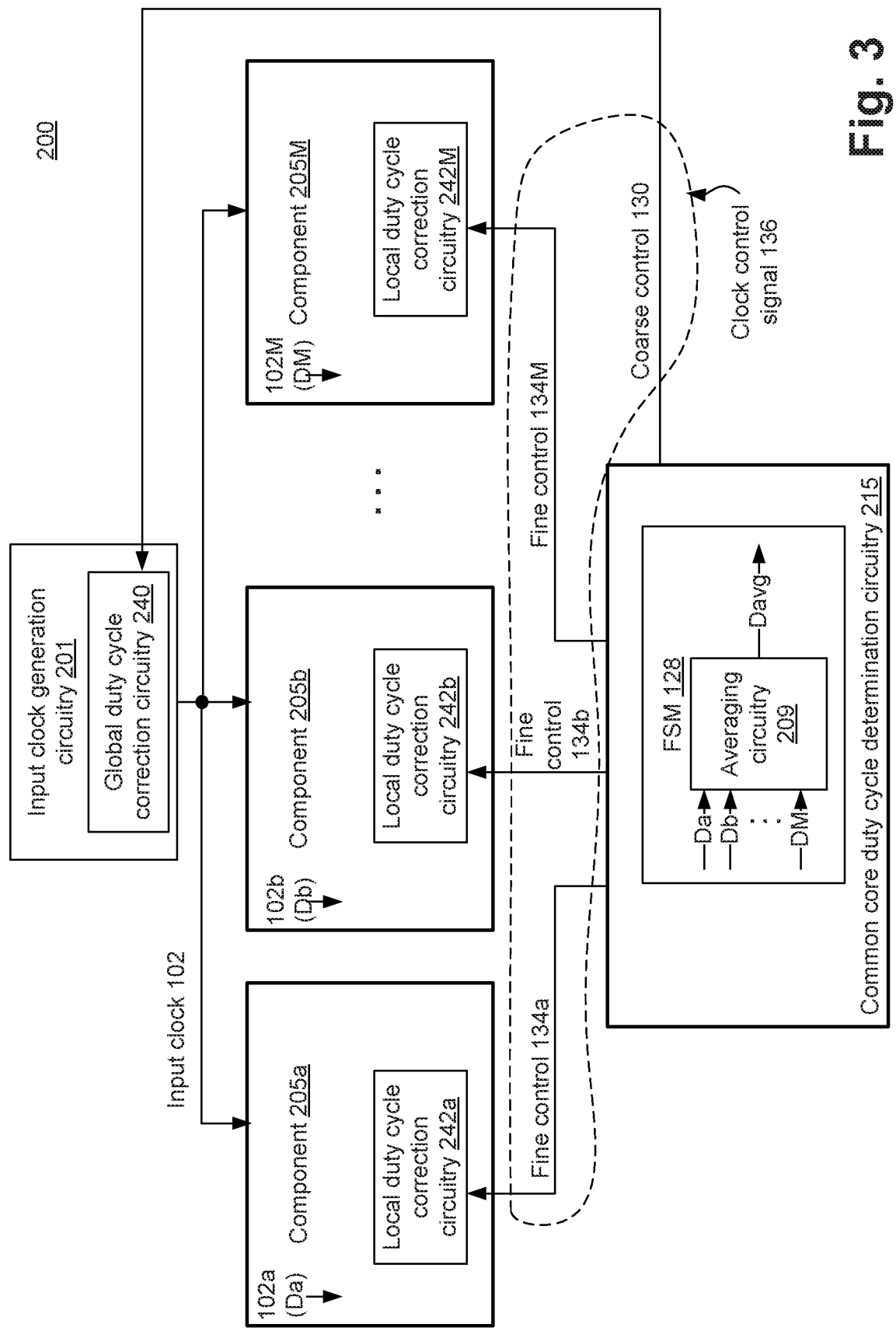
FIG. 3 illustrates one or more duty cycle correction circuitries of the system of FIGS. 2A-2B, according to some embodiments.

FIG. 3 illustrates one or more duty cycle correction circuitries of the system 200 of FIGS. 2A-2B, according to some embodiments. In FIG. 3, not all elements of the system 200 is illustrated (e.g., some of the elements of the M number of DCD circuitries are not illustrated). Rather, elements that are primarily associated with duty cycle corrections of the system 200 are illustrated in FIG. 3.

In some embodiments and as discussed with respect to FIG. 2A, the clock generation circuitry 201 comprises the global duty cycle correction circuitry 240. In some embodiments, individual components 205 comprise the corresponding local duty cycle correction circuitry 242, as illustrated in FIG. 3. In some embodiments, the circuitry 240 may alter phase of the input clock 102 generated by the clock generation circuitry 201; the circuitry 242a may alter phase of the clock 102a received by the component 205a; the circuitry 242M may alter phase of the clock 102M received by the component 205M; and so on.

In some embodiments, the global duty cycle correction circuitry 240 and the local duty cycle correction circuitries 242a, . . . , 242M are present in the system 200. In some other embodiments and contrary to the illustrations of FIG. 3, the global duty cycle correction circuitry 240 and merely some of the local duty cycle correction circuitries 242a, . . . , 242M are present. In some other embodiments and contrary to the illustrations of FIG. 3, either the global duty cycle correction circuitry 240, or at least some of the local duty cycle correction circuitries 242a, . . . , 242M are present. Thus, any combination of the global duty cycle correction circuitry 240 and the local duty cycle correction circuitries 242a, . . . , 242M may be present in the system 200.

The global duty cycle correction circuitry 240 and the local duty cycle correction circuitries 242a, . . . , 242M receive the clock control signal 136. As discussed with respect to FIG. 1, the clock control signal 136 comprises a coarse control signal 130 and one or more fine control signals 134a, 134b, . . . , 134M. The coarse control signal 130 may be based on a difference between average duty cycle Davg and a target duty cycle Dtar (e.g., coarse control signal 130 may be based on (Davg-Dtar)). As this difference is based on the average of the duty cycles Da, . . . , DM, this difference may be used by the global duty cycle correction circuitry 240 to compensate for any duty cycle errors in the input clock generation circuitry 201.

The fine control signal 134a may be based on (Da-Dtar); the fine control signal 134b may be based on (Db-Dtar); the fine control signal 134M may be based on (DM-Dtar), and so on. The local duty cycle correction circuitry 242a may receive the fine control signal 134a, and correct the duty cycle of the clock 102a received by the component; the local duty cycle correction circuitry 242M may receive the fine control signal 134M, and correct the duty cycle of the clock 102M received by the component; and so on.

In some embodiments, using the M number of duty cycle detection circuitries to detect the duty cycles Da, . . . , DM, Davg, and correcting for any duty cycle errors (e.g., using the circuitries 240, 242), may be performed during a boot-up process (e.g., while the system 200 starts or boots-up), during a start-up process of the clock generation circuitry 201, during any aperiodic or periodic intervals, when a drift of the duty cycle of the clock 102 is suspected, and/or the like.

Figure 4:
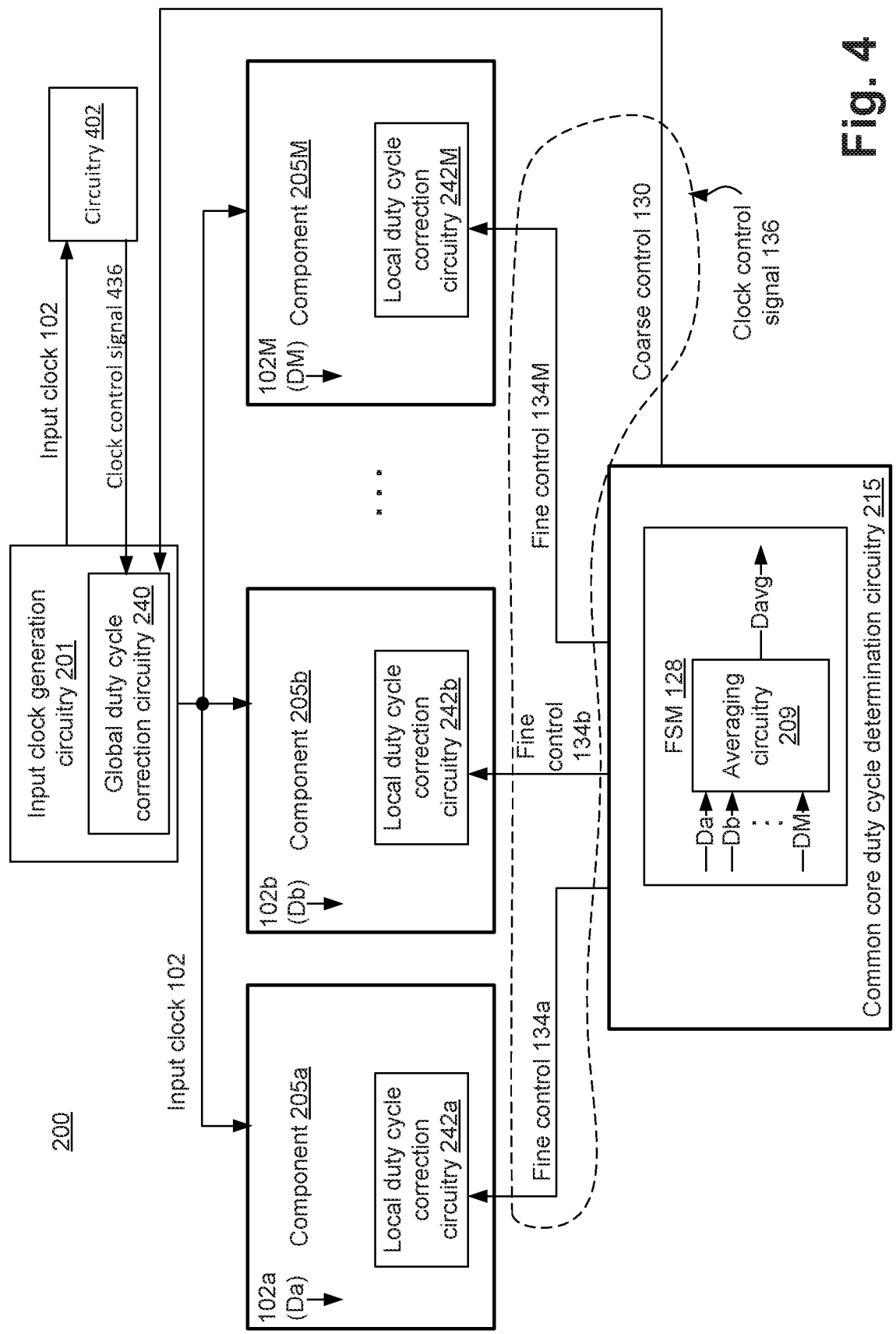
FIG. 4 illustrates the system of FIGS. 2A, 2B and 3, along with a dedicated DCD circuitry, according to some embodiments.

FIG. 4 illustrates the system 200 of FIGS. 2A, 2B and 3, along with a dedicated duty cycle detection (DCD) circuitry 402, according to some embodiments. For example, the M number of DCD circuitries of the system 200 (e.g., which determines the duty cycles Da, Db, . . . , Davg) may take relatively long time to determine the duty cycles (e.g., as the duty cycles Da, Db, . . . , DM are determines in a time-multiplexed serial fashion), and may not be operated frequently (e.g., may be operated during start-up, and/or at periodic or aperiodic intervals with relatively long gap between two operations). In some embodiments, the system 200 may include the dedicated DCD circuitry 402 for determining the duty cycle of the clock 102.

In an example, the circuitry 402 may be located physically proximally to the circuitry 201, e.g., such that the clock 102 has to traverse a shorter path to reach the circuitry 402 from the circuitry 201 (e.g., compared to a path taken by the clock 102 to reach the components 205a, . . . , 205M). The circuitry 402 may be similar to the DCD circuitry 100 of FIG. 1 (although the circuitry 402 may not include the duty cycle correction circuitry 140). The circuitry 402 may generate a clock control signal 436 (e.g., similar to the clock control signal 136), which may be used by the global duty cycle correction circuitry 240 to correct any duty cycle error of the clock 102.

In some embodiments, the circuitry 402 may be operated periodically or aperiodically, e.g., during start-up, after adjustment of a frequency of the clock 102 (e.g., due to a dynamic voltage-frequency scaling operation), after a power down event, and/or the like. Merely as an example, the circuitry 402 may be operated more frequently than the operation of the M number of DCD circuitries discussed with respect to FIGS. 2A-3.

Figure 5:
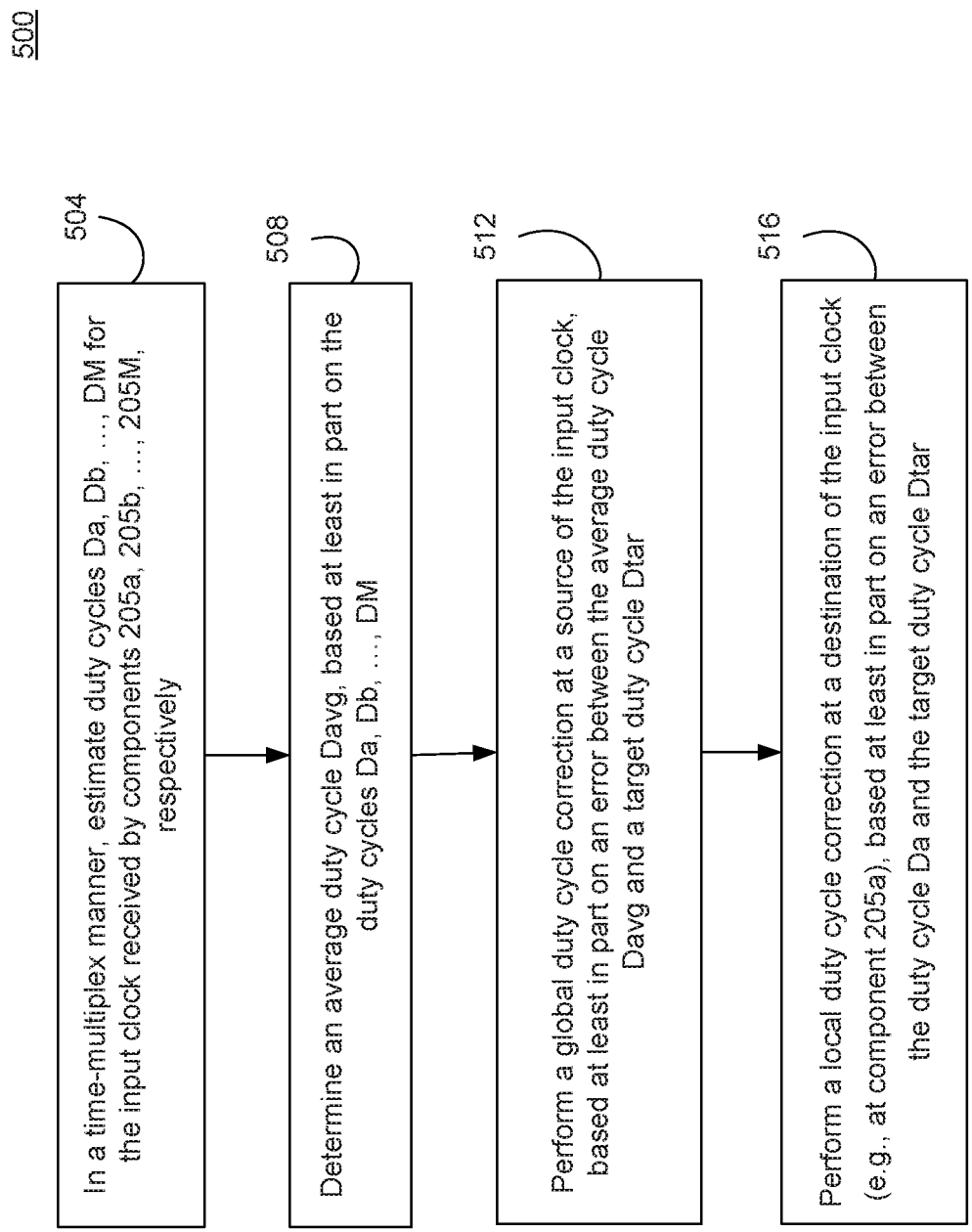
FIG. 5 illustrates a flowchart depicting a method for operating the system of any of FIGS. 2A-4, according to some embodiments.

FIG. 5 illustrates a flowchart depicting a method 500 for operating the system 200 of any of FIGS. 2A-4, according to some embodiments. Although the blocks in the flowchart with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 may be optional in accordance with certain embodiments. The numbering of the blocks presented is for the sake of clarity and is not intended to prescribe an order of operations in which the various blocks must occur.

At 504, in a time-multiplex manner, the system 200 (e.g., the M number of DCD circuitries discussed with respect to FIGS. 2A-4) estimates duty cycles Da, Db, DM for the input clocks 102a, 102b, . . . , 102M, respectively, received by the components 205a, 205b, . . . , 205M, respectively. At 508, the system 200 (e.g., the averaging circuitry 209 of the FSM 128) determines an average duty cycle Davg, based at least in part on the duty cycles Da, Db, . . . , DM.

At 512, the system 200 (e.g., the global duty cycle correction circuitry 240 of FIGS. 3-4) performs a global duty cycle correction at a source of the input clock (e.g., at the input clock generation circuitry 201), based at least in part on an error between the average duty cycle Davg and a target duty cycle Dtar. At 516, the system 200 (e.g., the local duty cycle correction circuitry 242a of FIGS. 3-4) performs a local duty cycle correction at a destination of the input clock 102a (e.g., at the component 205a), based at least in part on an error between the duty cycle Da and the target duty cycle Dtar.

Figure 6:
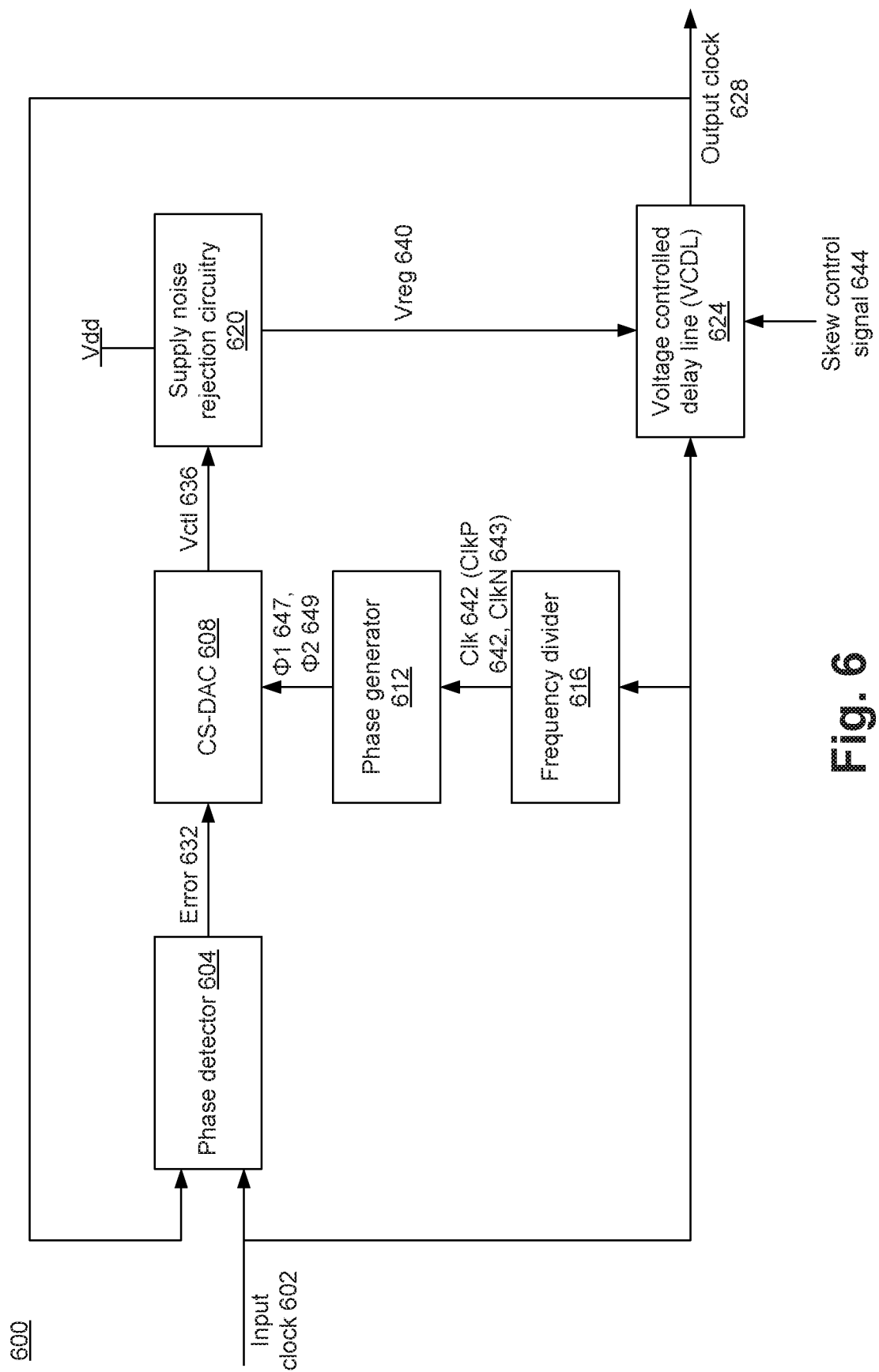
FIG. 6 illustrates an all-digital delay-locked loop (ADDLL) circuitry employing a Charge-Share (CS) Digital to Analog Converter (CS-DAC), according to some embodiments.

FIG. 6 illustrates an all-digital delay-locked loop (AD-DLL) circuitry 600 (also referred to as circuitry 600) employing a Charge-Share (CS) Digital to Analog Converter (CS-DAC) 608, according to some embodiments. The circuitry 600 comprises a phase detector 604, which compares phase of an input clock 602 with a phase of an output clock 628 that is output by the circuitry 600. Based on the comparison of the phases, the phase detector 604 outputs a stream or sequence of an error signal 632, which is indicative of a phase difference between the clocks 602 and 628.

In an example, the phase detector 604 is a Bang-bang phase detector (BBPD), and the error signal 632 is a single bit error signal. For example, the error signal 632 indicates whether the phase of the input clock 602 is lagging, or leading, the phase of the output clock 628 (e.g., without indicating an amount of the lag or lead).

In some embodiments, the circuitry 600 comprises the CS-DAC 608, which receives the error signal 632, and generates a control signal Vctl 636 based on the error signal 632 and also based on two non-overlapping phase signals φ1 647 and φ2 649. The CS-DAC 608 is discussed in further details with respect to FIG. 8.

Referring again to FIG. 6, the circuitry 600 comprises a frequency divider 616, which receives the input clock signal 602, and generates differential pair of clock signals ClkP 642 and ClkN 643, e.g., after dividing the clock 602 by an appropriate number. The differential pair of clock signals ClkP 642 and ClkN 643 are 180 degrees out of phase.

Figure 7:
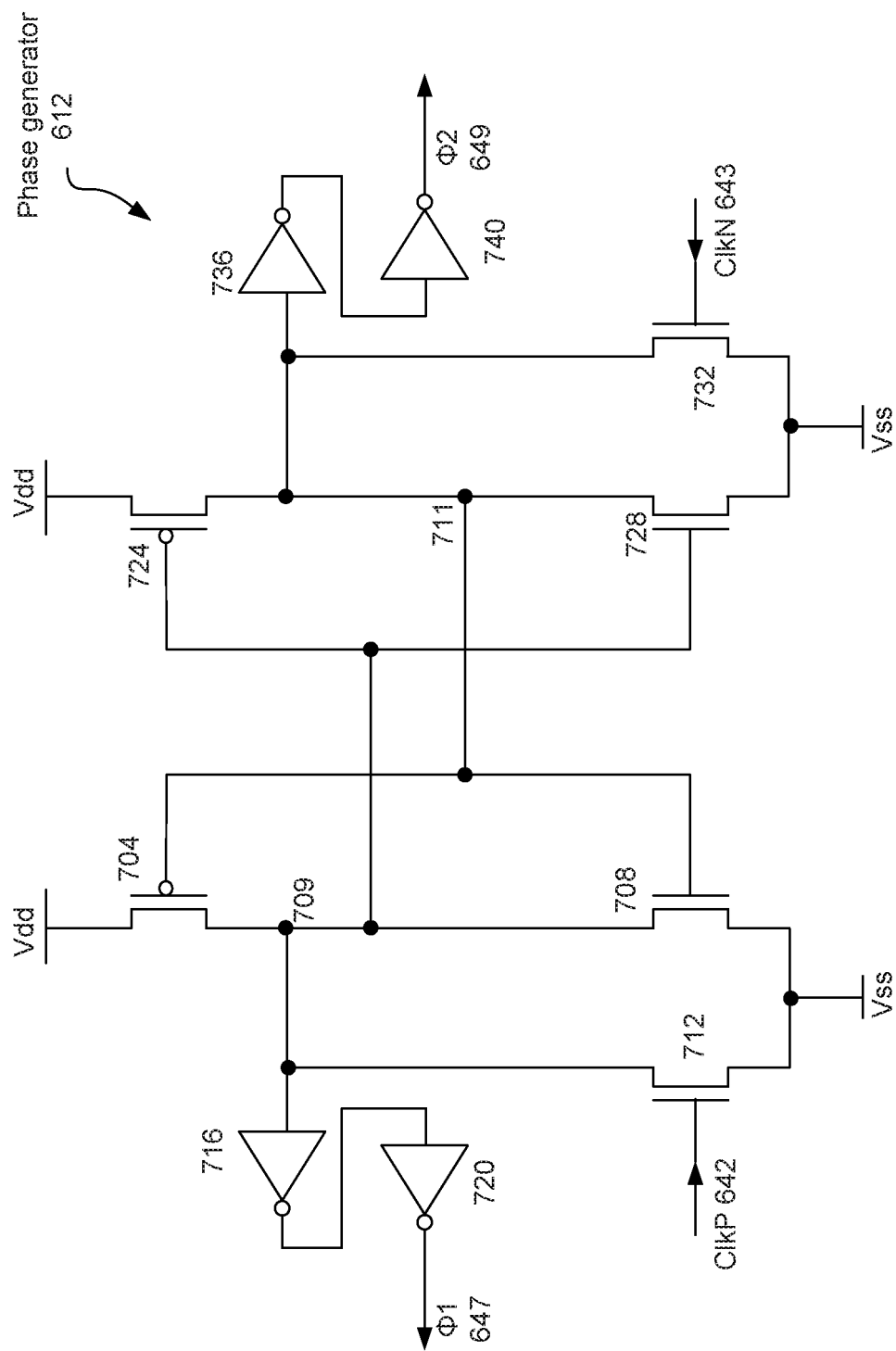
FIG. 7 illustrates a phase generator of the ADDLL circuitry of FIG. 6, according to some embodiments.

The circuitry 600 comprises a phase generator 612, which receives the differential pair of clock signals ClkP 642 and ClkN 643, and generates the two non-overlapping phase signals φ1 647 and φ2 649. FIG. 7 illustrates the phase generator 612 of the ADDLL circuitry 600 of FIG. 6, according to some embodiments. In an example, the phase generator 612 comprises transistors 704, 708 in series coupled between a supply voltage Vdd and a ground terminal Vss, and transistors 724, 728 in series coupled between the supply voltage Vdd and the ground terminal Vss. A node 709 between the transistors 704 and 708 is coupled to a series of inverters 716, 720, where the inverter 720 outputs the phase signal φ1 647. A node 711 between the transistors 724 and 728 is coupled to a series of inverters 736, 740, where the inverter 740 outputs the phase signal φ2 649.

A transistor 712 is coupled between the node 709 and the ground terminal Vss, where a gate of the transistor 712 receives the ClkP 642 from the frequency divider 616. A transistor 732 is coupled between the node 711 and the ground terminal Vss, where a gate of the transistor 732 receives the ClkN 643 from the frequency divider 616. A gate of the transistor 704 and a gate of the transistor 708 is coupled to the node 711, and a gate of the transistor 724 and a gate of the transistor 728 is coupled to the node 709.

The phase generator 612 receives the differential pair of clock signals ClkP 642 and ClkN642, and generates the two non-overlapping phase signals φ1 647 and φ2 649. For example, at a given time, at most one of the phase signals φ1 647 and φ2 649 can be high, e.g., as the phase signals φ1 647 and φ2 649 are non-overlapping. Although FIG. 7 illustrates an example of a phase generator that generates two non-overlapping phase signals φ1 647 and φ2 649, any other suitable circuitry may be used instead of the phase generator 612 of FIG. 7.

Figure 8:
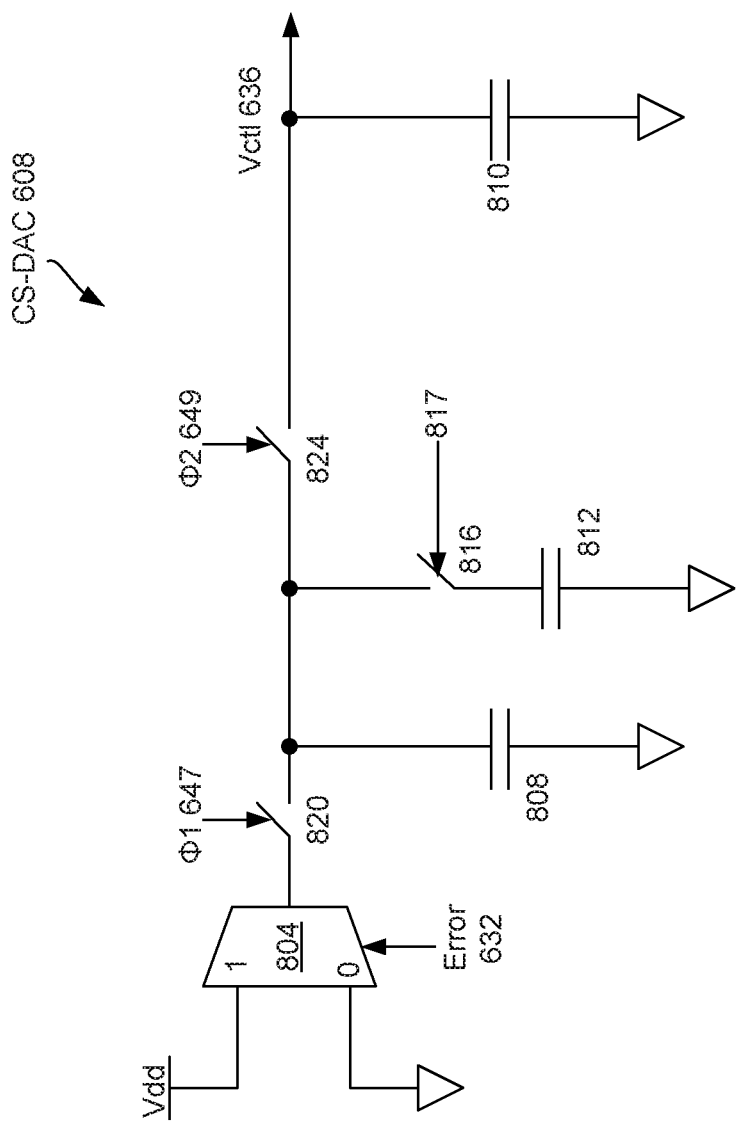
FIG. 8 illustrates the CS-DAC of the AADLL circuitry of FIG. 6 in further details, according to some embodiments.

Referring again to FIG. 6, the CS-DAC 608 receives the phase signals φ1 647 and φ2 649 and the error 632, and generates the control signal Vctl 636. FIG. 8 illustrates the CS-DAC 608 of the AADLL circuitry 600 of FIG. 6 in further details, according to some embodiments.

Referring now to FIG. 8, in some embodiments, the CS-DAC 608 comprises a multiplexer 804 having a first input terminal coupled to a supply voltage Vdd and a second input terminal coupled to ground. The multiplexer 804 is controlled by the error signal 632. Thus, the multiplexer 804 either outputs the voltage Vdd or a substantially zero volt signal (e.g., a ground voltage), based on the error signal 632. An output of the multiplexer 804 is coupled to a switch 820, which is coupled to another switch 824. An output of the switch 824 is the control signal 636.

A capacitor 808 is coupled between an output of the switch 820 and the ground terminal. A capacitor 812 and a switch 816 (e.g., which are coupled in series) are coupled between the output of the switch 820 and the ground terminal. A capacitor 810 is coupled between an output of the switch 824 and the ground terminal.

The switches 820 and 824 are respectively controlled by the phase signals φ1 647 and φ2 649. For example, when the phase signal φ1 647 is high, the switch 820 is closed; and when the phase signal φ1 647 is low, the switch 820 is open. Also, when the phase signal φ2 649 is high, the switch 824 is closed; and when the phase signal φ2 649 is low, the switch 824 is open. As the phase signals φ1 647 and φ2 649 are non-overlapping, the two switches 820, 824 cannot be simultaneously closed.

In some embodiments, when the phase signal φ1 647 is high, the CS-DAC 608 samples the input of the switch 820 (e.g., which is either zero, or supply voltage Vdd), and hence, the phase signal φ1 647 is also referred to as a sampling phase signal. In some embodiments, when the phase signal φ2 649 is high, the CS-DAC 608 distributes the output as control signal Vctl 636, and hence, the phase signal φ2 649 is also referred to as a distribution phase signal. As discussed herein, the phase signal φ1 647 and the phase signal φ2 649 cannot be simultaneously high.

During a high state of the sampling phase signal φ1 647 (e.g., when the switch 820 is closed), the capacitor 808 stores a charge, which can be either supply voltage Vdd or zero (e.g., because depending on a state of the error signal 632, the multiplexer 804 outputs either Vdd or zero). During a high state of the distribution phase signal φ2 649, the charge stored in the capacitor 808 is shared among the capacitors 808 and 810, and output as control signal Vctl.

Merely as an example, let the capacitance of the capacitor 808 be 2 picofarad (pF), the capacitance of the capacitor 810 be 2 pF, and voltage Vdd be 1 V. Then the control signal Vctl changes by about 1 millivolt (mV) in individual clock cycles.

Thus, for example, the error 632 is reflected in the control signal Vctl. For example, the error 632 can have a high state or a low state (e.g., depending on whether the phase of the input clock 602 is leading, or lagging, the output clock 628). The control signal Vctl 636 for a high state of the error 632, in the above discussed example, is about 1 mV higher than that for a low state of the error 632.

In an example (e.g., where the capacitance of individual ones of the capacitors 808, 810 is 2 pF, the voltage Vdd is 1 V, and a change in the control signal Vctl is about 1 mV), the CS-DAC circuitry 600 achieves about 10-bit resolution, e.g., which may reduce or minimize dithering jitter inherent to digital loop filter.

In some embodiments, switching on the switch 816 (e.g., using a control signal 817) may increase the capacitance between the output of the switch 820 and the ground terminal. Thus, during a high state of the sampling phase signal φ1 647 (e.g., when the switch 820 is closed), switching on the switch 816 will result in the capacitors 808 and 812 storing the charge (where the charge can be either Vdd or zero, as discussed herein above, depending on the state of the error signal 632). For example, enabling the capacitor 812 may improve a lock time of the AADLL circuitry 600.

The output of the CS-DAC 608 is received by a supply noise rejection circuitry 620. The supply noise rejection circuitry 620 may be a low dropout (LDO) voltage regulator, which generates a regulation signal Vreg 640 from the control signal 636. A voltage controlled delay line (VCDL) 624 receives the regulation signal Vreg 640 and the input clock 602, and generates the output clock 628. For example, the regulation signal Vreg 640 sets a delay of the VCDL 624, to generate the output clock 628 from the input clock 602. In some embodiments, the VCDL 624 is digitally controlled across process corners using a skew control signal 644.

In some embodiments, a bandwidth of the ADDLL circuitry 600 may be digitally controlled by varying the sampling frequency, a sampling capacitance C1, and/or a distribution capacitance C2 (e.g., where C2 is the capacitance of the capacitor 810). The sampling capacitance C1 is the capacitance of the capacitor 808 when the switch 816 is off, or is the capacitance of the capacitors 808 and 812 when the switch 816 is on. The bandwidth of the ADDLL may be represented by:

$$BW = \frac{1}{2n} \cdot f_s \cdot \frac{C1}{C2}. \quad \text{Equation 1}$$

In some embodiments, the ADDLL circuitry 600 may occasionally be in a low power state or a sleep state, e.g., during which the ADDLL circuitry 600 may not generate the clock 628. For example, one or more components of the circuitry 600 may be powered down and/or clock gated (e.g., the components do not receive power and/or clock signal). Merely as an example, the phase generator 612 may not generate the phase signals φ1 647 and φ2 649 during such a low power state, and consequently, the switches 820 and 824 may be open.

In some embodiments, during such a low power state the capacitor 810 may hold the control signal Vctl 636 signal, such that when the circuitry 600 exits the low power state, the control signal Vctl 636 is readily available to the supply noise rejection circuitry 620 and the VCDL 624. Thus, in a weak-lock scenario (e.g., when the circuitry 600 is exiting the low power state), the control signal Vctl 636 is readily available to control the VCDL 624. This reduces a latency of the circuitry 600 while exiting the low power state. For example, a drift of the capacitor 810 may be relatively less (e.g., the capacitor 810 may hold its charge for a relatively long time). Thus, if the circuitry 600 is in the low power state for a relatively short duration of time (e.g., short compared to a time period for which the capacitor 810 can hold its charge), the value of control signal Vctl 636 is effectively stored in the capacitor 810, such that the circuitry 600 can exit the low power state relatively faster (e.g., as the control signal Vctl 636 is readily available after exiting the low power state).

In some embodiments, another component, e.g., an analog to digital converter (ADC), such as a sigma-delta ADC used for thermal sensors (not illustrated in FIG. 6), may be used to store a digital code of the control signal 636 during normal operation. In a weak-lock scenario (e.g., when the circuitry 600 exits a low power state), by comparing the current digital code with a stored value of the digital code (e.g., as stored in the ADC), an error signal may be generated, which may be used to increase or decrease the control signal Vctl 636. In some embodiments, even during the low power mode, the phase signals φ1 647, φ2 649 may be generated, although at a lower frequency (e.g., a few Mega-Hertz, which may be less than a frequency of the phase signals φ1 647, φ2 649 during a normal mode of operation).

In an example, compared to analog delay locked loops (DLLs), conventional ADDLLs may suffer from jitter, poor area, power efficiency, etc. However, the ADDLL circuitry 600 of FIG. 6 includes an LDO based supply noise rejection circuitry 620, which supplies the VCDL 624 with quite (e.g., relatively noise-free) regulation signal Vred 640, e.g., thereby mitigating supply noise induced jitter. Unlike a conventional ADDLL with a large number of reconfigurable inverters at given supply, the supply noise rejection circuitry 620 sets delay of the inverters of the VCDL 624 to operate over a wide range of frequencies, e.g., thereby improving area and/or power efficiency of the circuitry 600. The circuitry 600 uses the charge-sharing DAC 608, which includes switched-capacitor loop filter, e.g., to convert one bit digital error signal 632 to analog voltage Vctl 636, which is used to generate the regulation signal Vreg 640 using the LDO based supply noise rejection circuitry 620. The CS-DAC 608 achieves a 10-bit resolution (e.g., 1 mV resolution of Vctl 636 at 1V VDD supply) and reduces (e.g., minimizes) dithering jitter that may be inherent to conventional digital feedback loop. In an example, the CS-DAC 608 extends the DLL weak-lock residency (e.g., which is associated with a transition from a low power or sleep state to a normal operating state of the circuitry 600), e.g., as the capacitor 810 may save the state of the Vctl 636 during the low power state. Adding an ADC in conjunction with CS-DAC, as discussed herein above, may further extend the weak-lock. The digitally-controllable loop bandwidth of the circuitry 600 may be controlled, e.g., as discussed with respect to equation 1.

Figure 9:
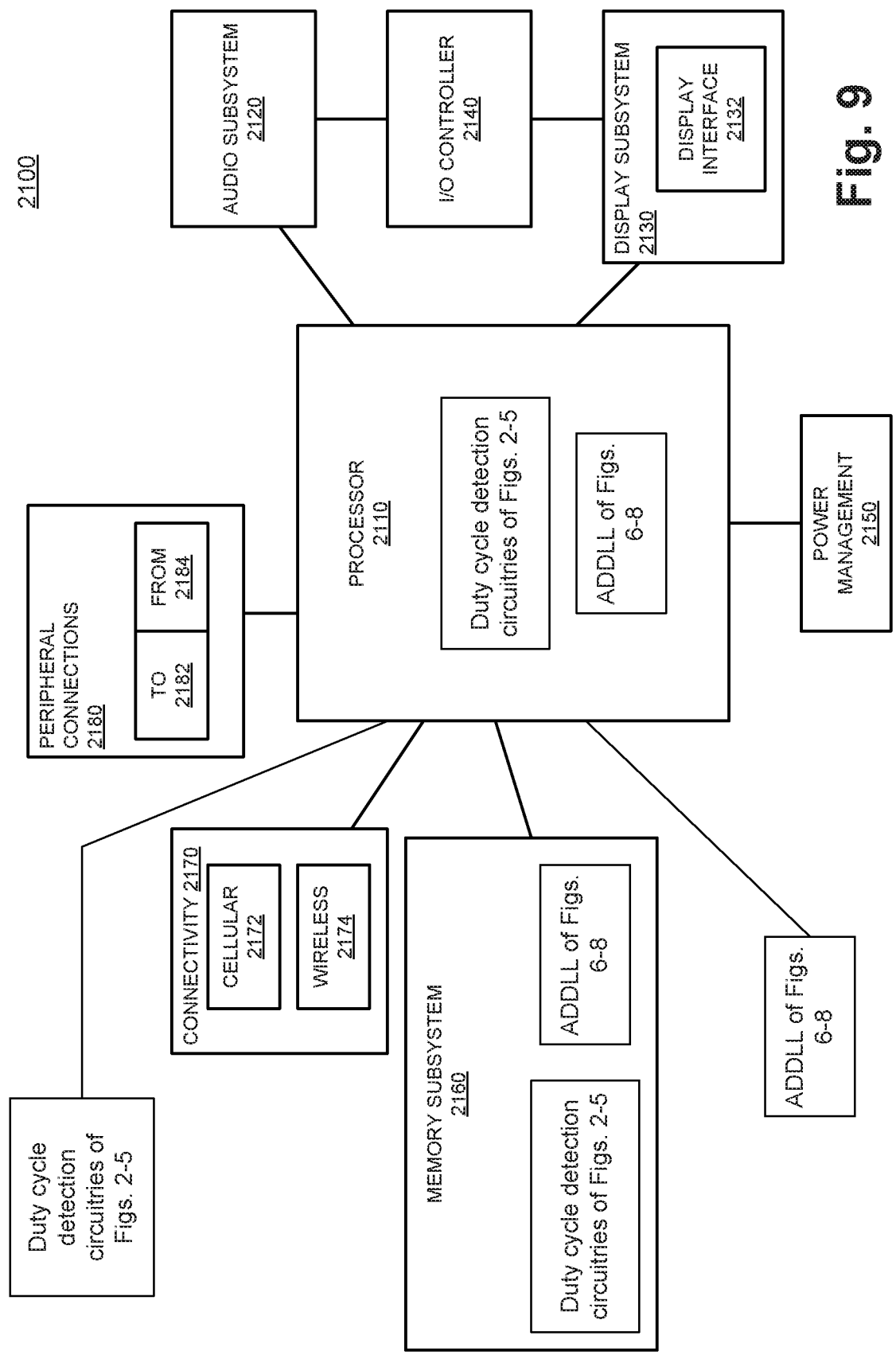
FIG. 9 illustrates a computer system, a computing device or a SoC (System-on-Chip), where the computing device includes the duty cycle detection and/or correction circuitries discussed with respect to FIGS. 1-5 and/or includes the ADDLL discussed with respect to FIGS. 6-8, according to some embodiments.

FIG. 9 illustrates a computer system, a computing device or a SoC (System-on-Chip) 2100, where the computing device includes the duty cycle detection and/or correction circuitries discussed with respect to FIGS. 1-5 and/or includes the ADDLL discussed with respect to FIGS. 6-8, according to some embodiments. It is pointed out that those elements of FIG. 9 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may comprise the duty cycle detection and/or correction circuitries discussed with respect to FIGS. 2A-5, e.g., to estimate duty cycles of clock signals received by individual components, to estimate an average duty cycle, and/or to correct any possible errors in the duty cycle. For example, the duty cycle detection circuitries may generate the clock control signal 136, e.g., to correct errors in the duty cycles, as discussed with respect to FIGS. 2A-5. The components 205 discussed with respect to FIGS. 2A-5 may be any appropriate component of the computing device 2100. Merely as an example, individual ones of the components 205 are data transmitter and/or receiver of a parallel interface, such as a parallel memory interface, of the computing device 2100. The parallel memory interface may be included in the processor 2110, coupled to the processor 2110, included in the memory subsystem 2160, coupled to the memory subsystem 2160, and/or the like. In another example, individual ones of the components 205 are any appropriate components, or within any appropriate component, of the computing device 2100. FIG. 9 illustrates some example locations of the duty cycle detection and/or correction circuitries discussed with respect to FIGS. 2A-5. For example, the duty cycle detection and/or correction circuitries discussed with respect to FIGS. 2A-5 may be within the processor 2110, within the memory subsystem 2160, or coupled to any component (e.g., processor 2110) of the computing device 2100.

In some embodiments, the computing device 2100 may comprise the ADDLL discussed with respect to FIGS. 6-8. The ADDLL may supply a clock signal, e.g., output clock 628, to one or more components of the computing device 2100. FIG. 9 illustrates example locations of the ADDLL of FIGS. 6-8. For example, the ADDLL may be within the processor 2110, within the memory subsystem 2160, or coupled to any component (e.g., processor 2110) of the computing device 2100.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Example 1. An apparatus comprising: a plurality of components; a first circuitry to generate a clock signal, and to supply the clock signal to the plurality of components; a second circuitry to estimate, for each of two or more components of the plurality of components, a corresponding duty cycle of the clock signal received at the corresponding component, such that the second circuitry is to estimate two or more duty cycles corresponding to the two or more components; a third circuitry to determine an average of the two or more duty cycles; and a fourth circuitry to correct a duty cycle of the clock signal generated by the first circuitry, based at least in part on the average.

Example 2. The apparatus of example 1 or any other examples, wherein: the fourth circuitry is to correct the duty cycle of the clock signal generated by the first circuitry, based at least in part on a difference between: the average of the two or more duty cycles, and a target duty cycle.

Example 3. The apparatus of example 1 or any other examples, further comprising: a fifth circuitry to correct a first duty cycle of the clock signal received by a first component of the plurality of components, based at least in part on a difference between: the first duty cycle estimated by the second circuitry for the first component, and a target duty cycle; and a sixth circuitry to correct a second duty cycle of the clock signal received by a second component of the plurality of components, based at least in part on a difference between: the second duty cycle estimated by the second circuitry for the second component, and the target duty cycle.

Example 4. The apparatus of example 1 or any other examples, wherein the two or more components comprise a first component and a second component, and wherein the second circuitry comprises: a first sampler circuitry to sample a first pair of differential clock signals to generate a first sampled signal, wherein the first sampler circuitry is included in the first component, and wherein the first pair of differential clock signals is from the clock signal received by the first component; and a second sampler circuitry to sample a second pair of differential clock signals to generate a second sampled signal, wherein the second sampler circuitry is included in the second component, and wherein the second pair of differential clock signals is from the clock signal received by the second component.

Example 5. The apparatus of example 4 or any other examples, wherein the second circuitry further comprises: a counter to receive the first sampled signal at a first time period, and to receive the second sampled signal at a second time period, wherein the second time period is separate in time compared to the first time period; and a logic to: estimate a first duty cycle of the clock signal received by the first component, based at least in part on the output of the counter at the first time period, and estimate a second duty cycle of the clock signal received by the second component, based at least in part on the output of the counter at the second time period.

Example 6. The apparatus of example 5 or any other examples, wherein the counter and the logic are external to the plurality of components.

Example 7. The apparatus of example 4 or any other examples, wherein the first pair of differential clock signals comprises: a first clock signal, and a second clock signal that is out of phase with the first clock signal by substantially 180 degrees, and wherein the first sampling circuitry is to: receive, in a time period of a first N number of pulses of an asynchronous clock signal, the first clock signal, wherein the asynchronous clock signal is asynchronous with respect to the first and second clock signals; and receive, in a time period of a second N number of pulses of the asynchronous clock signal, the second clock signal.

Example 8. The apparatus of example 7 or any other examples, wherein the second circuitry further comprises: an asynchronous clock signal generator to generate the asynchronous clock signal, and to transmit the asynchronous clock signal to the first sampler circuitry and the second sampling circuitry, wherein the asynchronous clock signal generator is external to the plurality of components.

Example 9. The apparatus of example 1 or any other examples, wherein an individual component of the plurality of component comprises a transmitter/receiver buffer (Tx/RX buffer) of a memory interface system.

Example 10. A system comprising: a memory to store instructions; a processor to execute the instructions; a wireless transceiver to facilitate communication between the processor and another system; a plurality of components, wherein an individual component of the plurality of components is a transmit/receive buffer that is to communicate with at least one of: the processor or the memory; a clock generation circuitry to generate a clock signal, and to supply the clock signal to the plurality of components; and a plurality of duty cycle detection (DCD) circuitries corresponding to the plurality of components, wherein an individual DCD circuitry is to estimate a corresponding duty cycle of the clock signal received at a corresponding component, such that a plurality of duty cycles is determined corresponding to the plurality of components, wherein the plurality of DCD circuitries comprises a common counter that is to be shared in a time-multiplexer manner among the plurality of DCD circuitries.

Example 11. The system of example 10 or any other examples, further comprising: a circuitry to determine an average of the plurality of duty cycles.

Example 12. The system of example 11 or any other examples, further comprising: a duty cycle correction circuitry to alter a phase of the clock signal generated by the clock generation circuitry, based at least in part on a difference between the average and a target duty cycle.

Example 13. The system of example 10 or any other examples, further comprising: a duty cycle correction circuitry to alter a phase of the clock signal received by a first component of the plurality of components, based at least in part on a difference between: a first duty cycle corresponding to the first component and a target duty cycle.

Example 14. The system of example 10 or any other examples, wherein the plurality of components is included in a parallel memory interface that is for communication between the processor and the memory.

Example 15. An apparatus comprising: a first circuitry to generate a clock signal, and to supply the clock signal to a first component and a second component; the first component comprising: a first splitter circuitry to receive the clock signal and to generate a first differential pair of clock signals, a first multiplexer to receive the first differential pair of clock signals, and a first sampler circuitry to sample an output of the first multiplexer; the second component comprising: a second splitter circuitry to receive the clock signal and to generate a second differential pair of clock signals, a second multiplexer to receive the second differential pair of clock signals, and a second sampler circuitry to sample an output of the second multiplexer; and a counter to receive, in a time multiplexed manner, an output of the first sampling circuitry and an output of the second sampling circuitry.

Example 16. The apparatus of example 15 or any other examples, wherein the clock signal is a first clock signal, and the wherein the apparatus comprises: a second circuitry to generate a second clock signal, and to supply the clock signal to the first sampler circuitry, the second sampler circuitry, and the counter.

Example 17. The apparatus of example 16 or any other examples, wherein the second clock signal is asynchronous with respect to the first clock signal.

Example 18. The apparatus of example 15 or any other examples, further comprising: a third circuitry to receive an output of the counter, and to estimate: a first duty cycle of the clock signal received by the first component, and a second duty cycle of the clock signal received by the second component.

Example 19. The apparatus of example 18 or any other examples, further comprising: a fourth circuitry to determine an average duty cycle, based at least in part on the first duty cycle and the second duty cycle.

Example 20. The apparatus of example 19 or any other examples, further comprising: a first duty cycle correction circuitry to correct a duty cycle of the clock signal generated by the first circuitry, based at least in part on the average duty cycle; a second duty cycle correction circuitry to correct the first duty cycle of the clock signal received by the first component, based at least in part on the first duty cycle; and a third duty cycle correction circuitry to correct the third duty cycle of the clock signal received by the second component, based at least in part on the second duty cycle.

Example 21. An apparatus comprising: a voltage controlled delay line (VCDL) to receive an input clock and generate an output clock; a phase detector to compare the input clock and the output clock, and to generate an error signal; a first circuitry comprising: a multiplexer to selectively output a supply voltage or a substantially zero voltage, based at least in part on the error signal, a first switch to transmit the output of the multiplexer to a second switch, and the second switch to output a control signal; and a second circuitry to control the VCDL, based at least in part on the control signal.

Example 22. The apparatus of example 21 or any other examples, wherein the first circuitry further comprises: a first capacitor coupled between an output of the first switch and a ground terminal; and a second capacitor coupled between an output of the second switch and the ground terminal.

Example 23. The apparatus of example 22 or any other examples, wherein: the first capacitor is to sample and hold the output of the multiplexer, in response to a closed state of the first switch; and the second capacitor is to hold the output of the multiplexer, in response to a closed state of the second switch.

Example 24. The apparatus of example 22 or any other examples, wherein the first circuitry further comprises: a second capacitor and a third switch coupled between the output of the first switch and the ground terminal.

Example 25. The apparatus of example 21 or any other examples, further comprising: a phase generator to generate: a first phase signal that is to control the first switch, and a second phase signal that is to control the second switch.

Example 26. The apparatus of example 21, wherein the first phase signal and the second phase signal are non-overlapping, such that the first phase signal and the second phase signal are not simultaneously at a logical high state.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
 a plurality of components;
 a first circuitry to generate a clock signal, and to supply the clock signal to the plurality of components;
 a second circuitry to estimate, for each of two or more components of the plurality of components, a corresponding duty cycle of the clock signal received at a corresponding component, such that the second circuitry is to estimate two or more duty cycles corresponding to the two or more components, wherein the second circuitry comprises a counter to receive, in a time multiplexed manner, an output of a first sampler circuitry and an output of a second sampler circuitry, wherein the counter is to track a number of is in the output of the first sampler circuitry, and wherein the counter is to track a number of is in the output of the second sampler circuitry;
 a third circuitry to determine an average of the two or more duty cycles; and
 a fourth circuitry to correct a duty cycle of the clock signal generated by the first circuitry, based at least in part on the average and based on a fine control and a coarse control.

2. The apparatus of claim 1, wherein:
the fourth circuitry is to correct the duty cycle of the clock signal generated by the first circuitry, based at least in part on a difference between: the average of the two or more duty cycles, and a target duty cycle.

3. The apparatus of claim 1, further comprising:
a fifth circuitry to correct a first duty cycle of the clock signal received by a first component of the plurality of components, based at least in part on a difference between: the first duty cycle estimated by the second circuitry for the first component, and a target duty cycle; and
a sixth circuitry to correct a second duty cycle of the clock signal received by a second component of the plurality of components, based at least in part on a difference between: the second duty cycle estimated by the second circuitry for the second component, and the target duty cycle.

4. The apparatus of claim 1, wherein the two or more components comprise a first component and a second component, and wherein the second circuitry comprises:
the first sampler circuitry to sample a first pair of differential clock signals to generate a first sampled signal, wherein the first sampler circuitry is included in the first component, and wherein the first pair of differential clock signals is from the clock signal received by the first component; and
the second sampler circuitry to sample a second pair of differential clock signals to generate a second sampled signal, wherein the second sampler circuitry is included in the second component, and wherein the second pair of differential clock signals is from the clock signal received by the second component.

5. The apparatus of claim 4, wherein the counter is to receive the first sampled signal at a first time period, and to receive the second sampled signal at a second time period, wherein the second time period is separate in time compared to the first time period; and
a logic to:
estimate a first duty cycle of the clock signal received by the first component, based at least in part on the output of the counter at the first time period, and
estimate a second duty cycle of the clock signal received by the second component, based at least in part on the output of the counter at the second time period.

6. The apparatus of claim 5, wherein the counter and the logic are external to the plurality of components.

7. The apparatus of claim 4, wherein the first pair of differential clock signals comprises: a first clock signal, and a second clock signal that is out of phase with the first clock signal by substantially 180 degrees, and wherein the first sampler circuitry is to:
receive, in a time period of a first N number of pulses of an asynchronous clock signal, the first clock signal, wherein the asynchronous clock signal is asynchronous with respect to the first and second clock signals; and
receive, in a time period of a second N number of pulses of the asynchronous clock signal, the second clock signal.

8. The apparatus of claim 7, wherein the second circuitry further comprises:
an asynchronous clock signal generator to generate the asynchronous clock signal, and to transmit the asynchronous clock signal to the first sampler circuitry and the second sampler circuitry,
wherein the asynchronous clock signal generator is external to the plurality of components.

9. The apparatus of claim 1, wherein an individual component of the plurality of components comprises a transmitter/receiver buffer (Tx/RX buffer) of a memory interface system.

10. A system comprising:
a memory to store instructions;
a processor to execute the instructions;
a wireless transceiver to facilitate communication between the processor and another system;
a plurality of components, wherein an individual component of the plurality of components is a transmit/receive buffer that is to communicate with at least one of: the processor or the memory;
a clock generation circuitry to generate a clock signal, and to supply the clock signal to the plurality of components; and
a plurality of duty cycle detection (DCD) circuitries corresponding to the plurality of components, wherein an individual DCD circuitry is to estimate a corresponding duty cycle of the clock signal received at a corresponding component, such that a plurality of duty cycles is determined corresponding to the plurality of components; and
a circuitry to determine an average of the plurality of duty cycles,
wherein the plurality of DCD circuitries comprises a common counter that is to be shared in a time-multiplexer manner among the plurality of DCD circuitries.

11. The system of claim 10, further comprising:
a duty cycle correction circuitry to alter a phase of the clock signal generated by the clock generation circuitry, based at least in part on a difference between the average and a target duty cycle.

12. The system of claim 10, further comprising:
a duty cycle correction circuitry to alter a phase of the clock signal received by a first component of the plurality of components, based at least in part on a difference between: a first duty cycle corresponding to the first component and a target duty cycle.

13. The system of claim 10, wherein the plurality of components is included in a parallel memory interface that is for communication between the processor and the memory.

14. An apparatus comprising:
a first circuitry to generate a clock signal, and to supply the clock signal to a first component and a second component;
the first component comprising a first transmitter buffer and/or a first receiver buffer of a first memory interface system, the first component comprising:
a first splitter circuitry to receive the clock signal and to generate a first differential pair of clock signals,
a first multiplexer to receive the first differential pair of clock signals, and
a first sampler circuitry to sample an output of the first multiplexer;
the second component comprising a second transmitter buffer and/or a second receiver buffer of a second memory interface system, the second component comprising:
a second splitter circuitry to receive the clock signal and to generate a second differential pair of clock signals,
a second multiplexer to receive the second differential pair of clock signals, and a second sampler circuitry to sample an output of the second multiplexer; and a counter to receive, in a time multiplexed manner, an output of the first sampler circuitry and an output of the second sampler circuitry, wherein the counter is to track a number of is in an output of the first sampler circuitry, and wherein the counter is to track a number of is in an output of the second sampler circuitry.

15. The apparatus of claim 14, wherein the clock signal is a first clock signal, and wherein the apparatus comprises:
a second circuitry to generate a second clock signal, and to supply the clock signal to the first sampler circuitry, the second sampler circuitry, and the counter.

16. The apparatus of claim 15, wherein the second clock signal is asynchronous with respect to the first clock signal.

17. The apparatus of claim 14, further comprising:
a third circuitry to receive an output of the counter, and to estimate: a first duty cycle of the clock signal received by the first component, and a second duty cycle of the clock signal received by the second component.

18. The apparatus of claim 17, further comprising:
a fourth circuitry to determine an average duty cycle, based at least in part on the first duty cycle and the second duty cycle.

19. The apparatus of claim 18, further comprising:
a first duty cycle correction circuitry to correct a duty cycle of the clock signal generated by the first circuitry, based at least in part on the average duty cycle;
a second duty cycle correction circuitry to correct the first duty cycle of the clock signal received by the first component, based at least in part on the first duty cycle; and
a third duty cycle correction circuitry to correct the second duty cycle of the clock signal received by the second component, based at least in part on the second duty cycle.

20. An apparatus comprising:
a plurality of components;
means to estimate, in a time-multiplex manner, duty cycles for input clocks received by the plurality of components;
means to determine an average duty cycle based on the duty cycles for the input clocks received by the plurality of components;
means to perform duty cycle correction at a source of the input clocks, based at least in part on an error between the average duty cycle and a target duty cycle; and
means to perform duty cycle correction, at an individual component of the plurality of components, based at least in part on an error between a duty cycle for an input clock at the individual component and the target duty cycle.

21. The apparatus of claim 20, wherein the individual component of the plurality of components comprises a transmitter buffer and/or receiver buffer of a memory interface system.

22. The apparatus of claim 20, wherein the source of the input clock comprises means for generating a common clock, wherein the common clock is provided as input clocks to the plurality of components.

23. The apparatus of claim 22 comprises means for detecting duty cycle of the common clock.

24. The apparatus of claim 23, wherein the means for detecting duty cycle of the common clock operates upon one or more events comprising: upon start-up, after adjustment of a frequency of the common clock, or after a power down event.

25. The apparatus of claim 24, wherein the means for detecting the duty cycle of the common clock comprises:
means for splitting the common clock into differential clocks;
means for sampling the differential clocks in a time multiplex manner;
means for counting number of ones in the differential clocks;
means for generating a ratio of the number of ones in the differential clocks, to determine the duty cycle of the common clock; and
means for correcting the duty cycle of the common clock using coarse and fine controls that are based on the ratio of the number of ones.

* * * * *